US012796094B2

(12) United States Patent
Jeong et al.

(10) Patent No.: US 12,796,094 B2
(45) Date of Patent: Nov. 10, 2026

(54) DISPLAY DEVICE

(71) Applicant: LG Display Co., Ltd., Seoul (KR)

(72) Inventors: YuRa Jeong, Seoul (KR); SungJoon Min, Goyang-si (KR); HaeYoon Jung, Seoul (KR); Sujin Ham, Seoul (KR); MyungSub Lim, Seoul (KR); Heewon Kim, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 444 days.

(21) Appl. No.: 18/495,601

(22) Filed: Oct. 26, 2023

(65) Prior Publication Data

US 2024/0153969 A1 May 9, 2024

(30) Foreign Application Priority Data

Nov. 4, 2022 (KR) ........................ 10-2022-0146409

(51) Int. Cl.

| | |
|---|---|
| ***H01L 27/12*** | (2006.01) |
| ***H10D 86/40*** | (2025.01) |
| ***H10D 86/60*** | (2025.01) |
| ***H10H 20/857*** | (2025.01) |
| ***H10W 90/00*** | (2026.01) |

(52) U.S. Cl.

CPC ........... *H10D 86/60* (2025.01); *H10D 86/443* (2025.01); *H10H 20/857* (2025.01); *H10W 90/00* (2026.01)

(58) Field of Classification Search

CPC .... H10D 86/60; H10D 86/443; H10H 20/857; H10W 90/00

See application file for complete search history.

(56) References Cited

U.S. PATENT DOCUMENTS

| | | | | |
|---|---|---|---|---|
| 2021/0126082 | A1* | 4/2021 | Yoon | H10K 50/856 |
| 2021/0183962 | A1* | 6/2021 | Kim | G09G 3/035 |
| 2022/0139888 | A1 | 5/2022 | Kim et al. | |
| 2022/0165918 | A1* | 5/2022 | Bower | G09G 3/3208 |
| 2023/0215874 | A1* | 7/2023 | Jeong | H10D 86/60 257/72 |

FOREIGN PATENT DOCUMENTS

| | | | |
|---|---|---|---|
| KR | 10-2021-0074627 | A | 6/2021 |
| KR | 20220059284 | A | 5/2022 |

* cited by examiner

*Primary Examiner* — William C Trapanese

(74) *Attorney, Agent, or Firm* — Seed Intellectual Property Law Group LLP

(57) ABSTRACT

A display device includes a stretchable lower substrate; a plurality of first plate patterns which is disposed on the lower substrate; a plurality of first line patterns disposed between the plurality of first plate patterns; a plurality of first connection lines which extends in a first direction; a plurality of second connection lines which extends in a second direction; and a plurality of third connection lines which extends in a direction different from the first direction and the second direction to be connected to four first plate patterns which are adjacent to each other. Accordingly, the plurality of third connection lines which connects wiring lines on the plurality of first plate patterns in a mesh structure is formed to reduce a wiring line resistance.

14 Claims, 10 Drawing Sheets

DISPLAY DEVICE

CROSS-REFERENCE TO RELATED APPLICATIONS

This application claims the priority of Korean Patent Application No. 10-2022-0146409 filed on Nov. 4, 2022, in the Korean Intellectual Property Office, the disclosure of which is incorporated herein by reference.

BACKGROUND

Technical Field

The present disclosure relates to a display device, and more particularly to a stretchable display device.

Description of the Related Art

As display devices which are used for a monitor of a computer, a television, a cellular phone, or the like, there are an organic light emitting display (OLED: 170) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, recently, a display device which is manufactured by forming a display unit, a wiring line, and the like on a flexible substrate such as plastic which is a flexible material so as to be stretchable in a specific direction and changed in various forms is getting attention as a next generation display device.

BRIEF SUMMARY

A benefit to be achieved by the present disclosure is to provide a display device in which power lines are connected in a mesh type to reduce a resistance of the power lines.

Another benefit to be achieved by the present disclosure is to provide a display device in which a fluctuation of a high potential power voltage or a low potential power voltage is minimized or reduced to reduce luminance irregularity.

Still another benefit to be achieved by the present disclosure is to provide a display device in which a design area of a connection line is increased or ensured to be the maximum.

Still another benefit to be achieved by the present disclosure is to provide a display device in which over-etching of the connection substrate is reduced or minimized.

Benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, a display device includes a stretchable lower substrate; a plurality of first plate patterns which is disposed on the lower substrate to be spaced apart from each other; a plurality of first line patterns disposed between the plurality of first plate patterns; and a plurality of connection lines disposed on the plurality of first line patterns, and the plurality of connection lines includes: a plurality of first connection lines which extends in a first direction to be connected to two of the plurality of first plate patterns which are adjacent to each other; a plurality of second connection lines which extends in a second direction to be connected to another two of the plurality of first plate patterns which are adjacent to each other; and a plurality of third connection lines which extends in a direction different from the first direction and the second direction to be connected to four of the plurality of first plate patterns which are adjacent to each other. Accordingly, the plurality of third connection lines which connects wiring lines on the plurality of first plate patterns in a mesh structure is formed to reduce a wiring line resistance.

Other detailed matters of the example embodiments are included in the detailed description and the drawings.

According to the present disclosure, the power lines are connected in a mesh type to reduce the resistance of the power line and minimize or reduce the drop of the power voltage.

According to the present disclosure, uniform power voltage is supplied to a plurality of sub pixels to improve luminance uniformity.

According to the present disclosure, a design area of the connection line is ensured to increase a ratio of an entire line with respect to the entire width of the connection line and improve the stretchability of the display device.

According to the present disclosure, the connection substrates are uniformly disposed on the entire display device to suppress the over-etching of the connection substrate.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
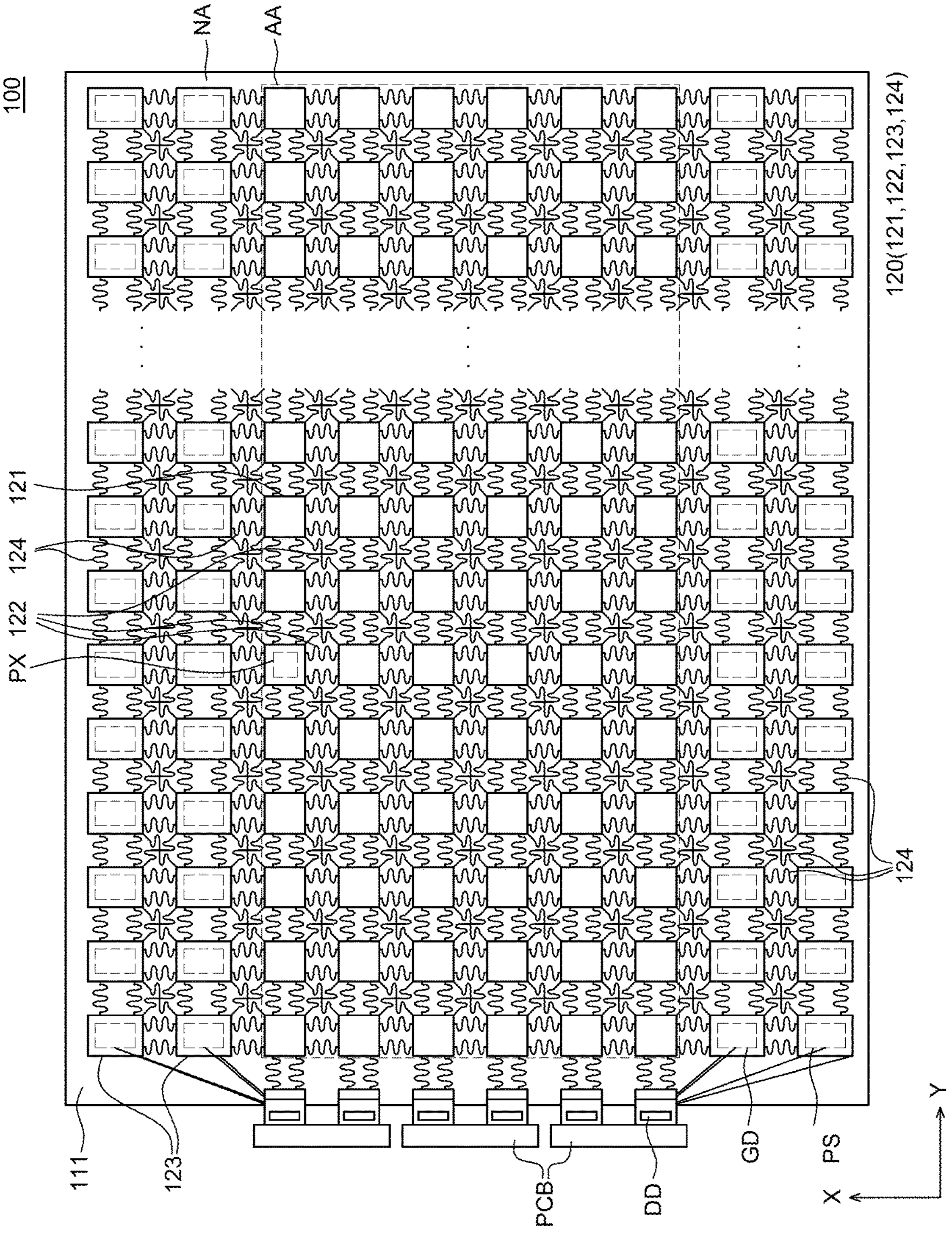
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below." and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

Figure 2:
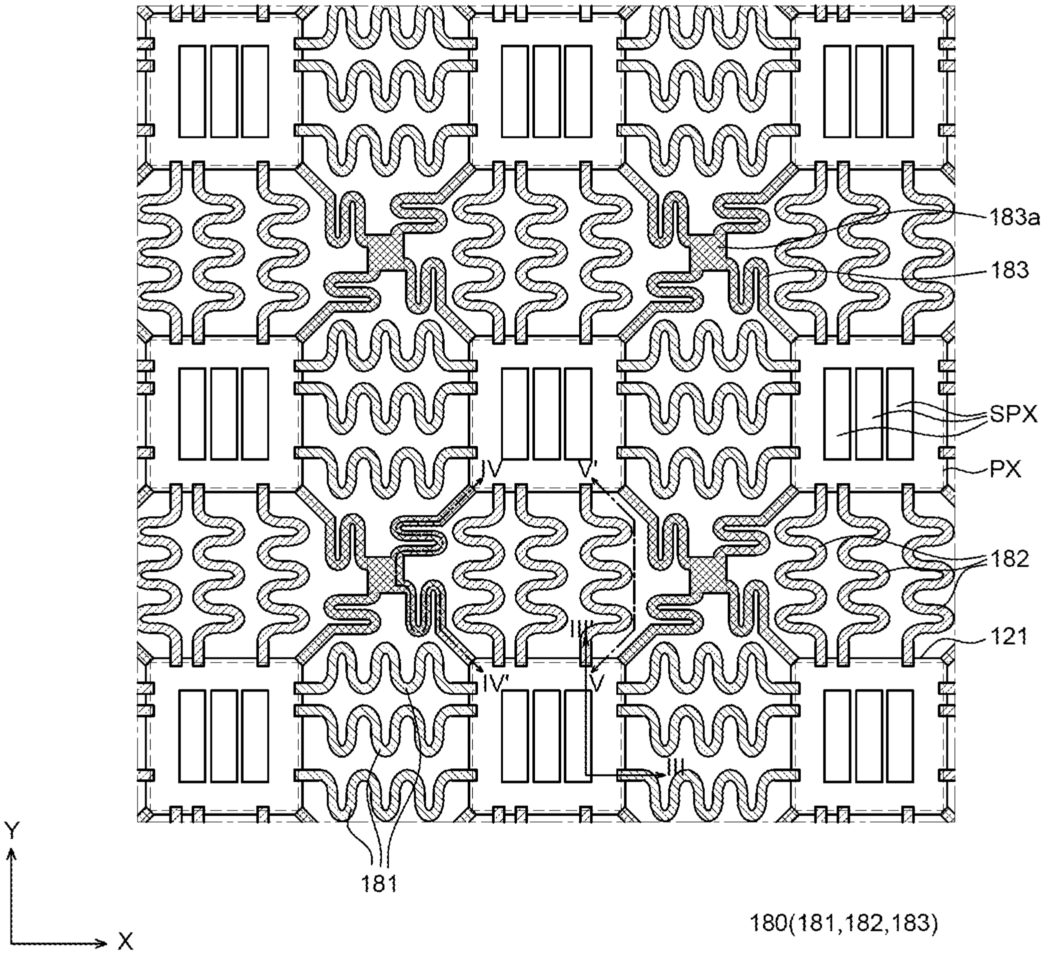
FIG. 2 is an enlarged plan view of an active area of a display device according to an example embodiment of the present disclosure.
Figure 3:
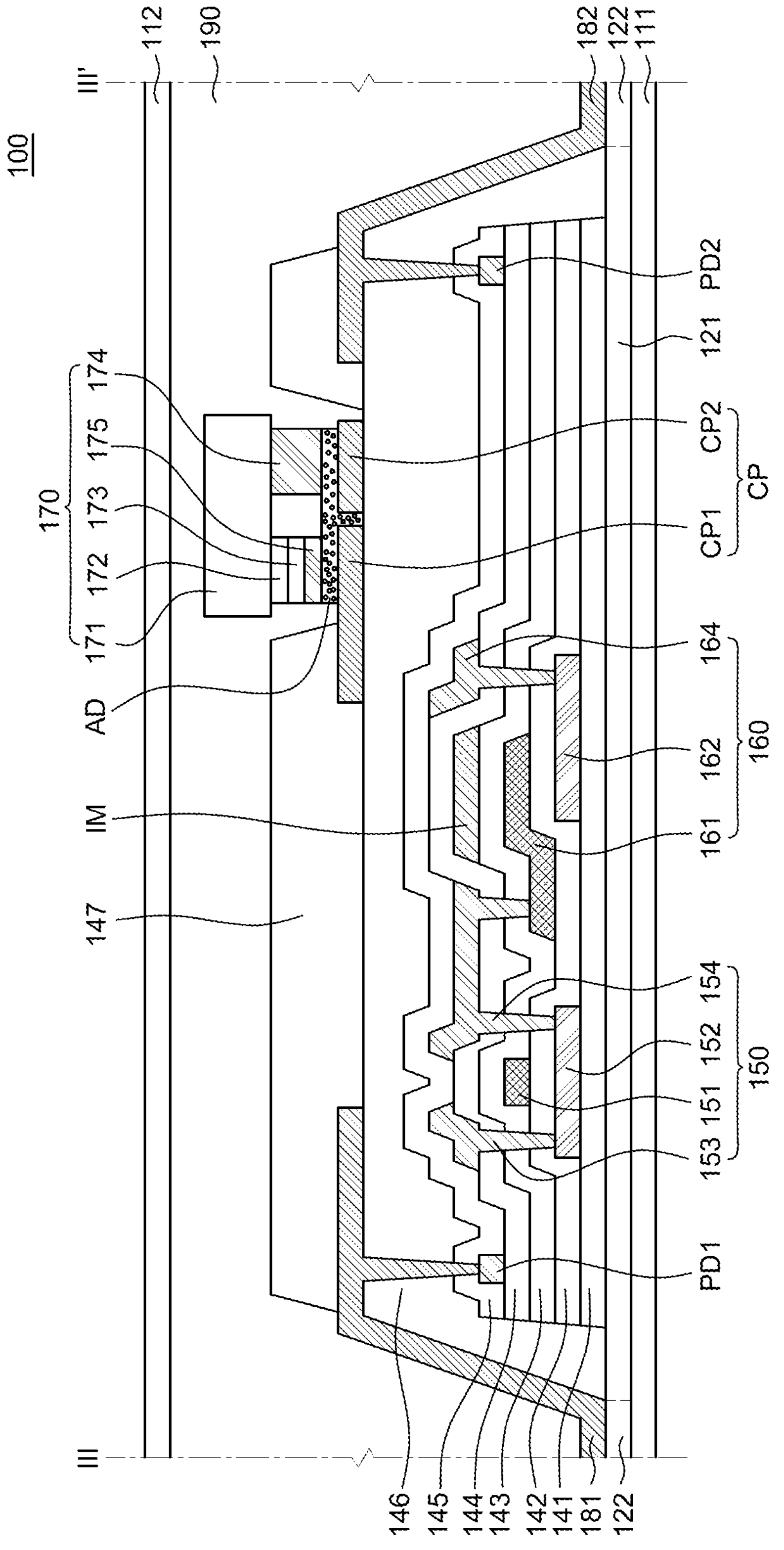
FIG. 3 is a cross-sectional view taken along the line III-III' of FIG. 2.
Figure 4:
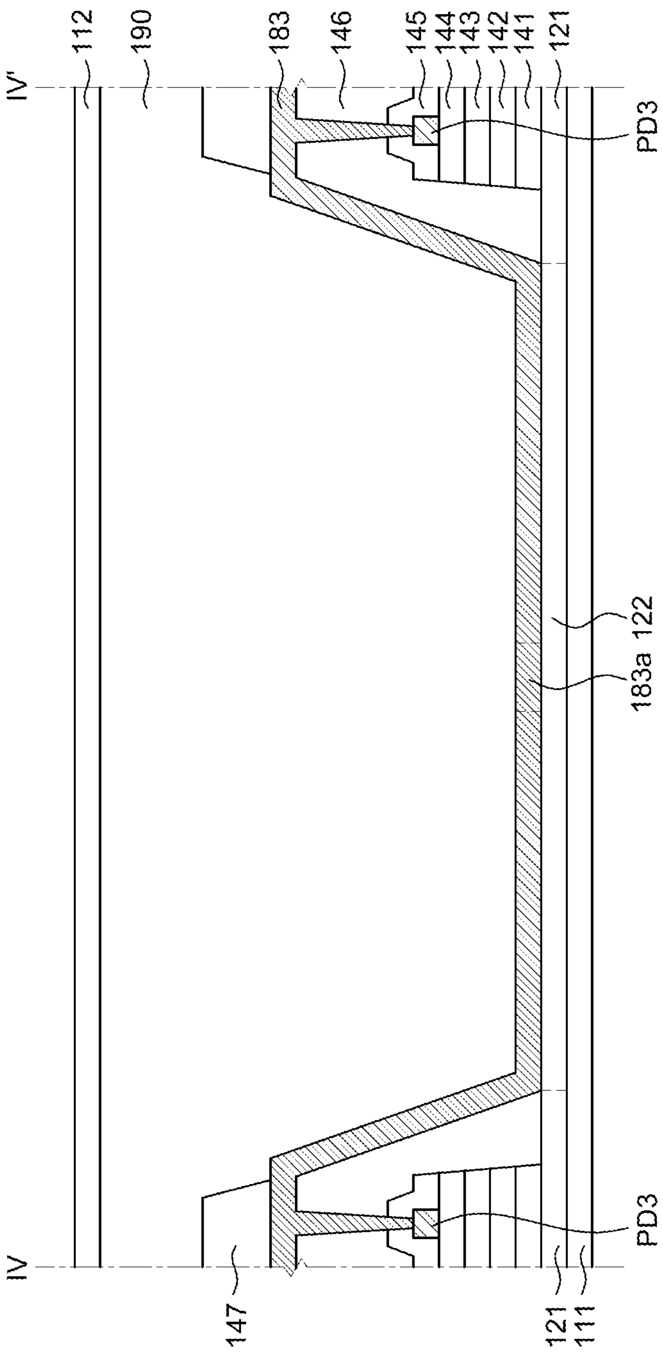
FIG. 4 is a cross-sectional view taken along the line IV-IV' of FIG. 2.
Figure 5:
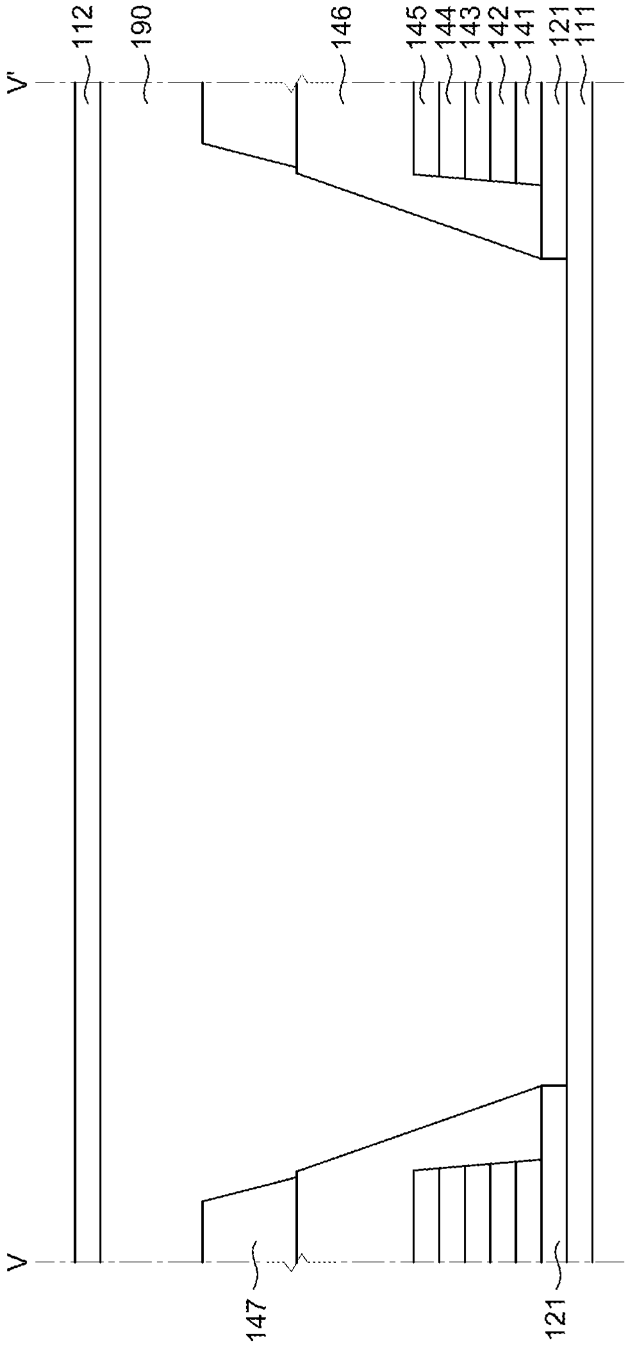
FIG. 5 is a cross-sectional view taken along the line V-V' of FIG. 2.

FIG. 1 is a plan view of a display device according to an example embodiment of the present disclosure. FIG. 2 is an enlarged plan view of an active area of a display device according to an example embodiment of the present disclosure. FIG. 3 is a cross-sectional view taken along the line III-III' of FIG. 2. FIG. 4 is a cross-sectional view taken along the line IV-IV' of FIG. 2. FIG. 5 is a cross-sectional view taken along the line V-V' of FIG. 2.

First, a display device 100 according to an example embodiment of the present disclosure is a display device which is capable of displaying images even in a bent or extended state and may be also referred to as a stretchable display device, a flexible display device and an extendable display device. As compared with the general display devices of the related art, the display device 100 has not only a high flexibility, but also stretchability. Therefore, the user may bend or extend a display device 100 and a shape of a display device 100 may be freely changed in accordance with manipulation of a user. For example, when the user pulls the display device 100 by holding ends of the display device, the display device 100 may be extended to the pulling direction of the user. Alternatively, when the user disposes the display device 100 on an outer surface which is not flat, the display device 100 may be disposed to be bent in accordance with the shape of the outer surface of the wall. Further, when a force applied by the user is removed, the display device 100 may return to its original shape.

Referring to FIGS. 1 to 3, a display device 100 according to an example embodiment of the present disclosure includes a lower substrate 111, an upper substrate 112, a pattern layer 120, a plurality of pixels PX, a gate driver GD, a data driver DD, a power supply PS, and a printed circuit board PCB.

The lower substrate 111 is a configuration which supports and protects several components of the display device 100. The lower substrate 111 may support the pattern layer 120 on which the pixels PX, the gate driver GD, and the power supply PS are formed. The upper substrate 112 is a configuration which covers and protects several components of the display device 100. The upper substrate 112 may cover the pixels PX, the gate driver GD, and the power supply PS.

The lower substrate 111 and the upper substrate 112 which are flexible substrates may be configured by an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are ductile substrates so as to be reversibly expandable and contractible. Therefore, the lower substrate 111 may also be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. Further, the upper substrate 112 may also be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate 111 may be 10 um to 1 mm, but is not limited thereto.

Referring to FIG. 1, the lower substrate 111 may have an active area AA and a non-active area NA enclosing the active area AA. However, the active area AA and the non-active area NA are not mentioned to be limited to the lower substrate 111, but mentioned for the entire display device 100.

The active area AA is an area where images are displayed. The plurality of pixels PX is disposed in the active area AA. Each of the plurality of pixels PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a scan line, a data line, a reference line, an emission control line, a high potential power line, and a low potential power line.

The non-active area NA is an area where no image is displayed. The non-active area NA is an area adjacent to the active area AA. The non-active area NA is adjacent to the active area AA to enclose the active area AA. However, it is not limited thereto so that the non-active area NA corresponds to an area excluding the active area AA from the lower substrate 111 and may be modified and separated in various forms. In the non-active area NA, various components for driving a plurality of pixels PX disposed in the active area AA, such as a gate driver GD and a power supply PS, may be disposed. In the non-active area NA, a plurality of pads connected to the data driver DD and the printed circuit board PCB may be disposed and each pad may be electrically connected to each of the plurality of pixels PX of the active area AA.

The pattern layer 120 may be disposed on the lower substrate 111. The pattern layer 120 may include a plurality of first plate patterns 121 and a plurality of first line patterns 122 disposed in the active area AA and a plurality of second plate patterns 123 and a plurality of second line patterns 124 disposed in the non-active area NA.

The plurality of first plate patterns 121 is disposed in the active area AA of the lower substrate 111 and the plurality of second plate patterns 123 is disposed in the non-active area NA of the lower substrate 111. The plurality of first plate patterns 121 and the plurality of second plate patterns 123 may be disposed to be spaced apart from each other. The plurality of first plate patterns 121 and the plurality of second plate patterns 123 may be disposed in the form of separate islands. The plurality of first plate patterns 121 and the plurality of second plate patterns 123 may be individually separated, respectively. Therefore, the plurality of first plate patterns 121 and the plurality of second plate patterns 123 may be referred to as first island patterns and second island patterns or first individual patterns and second individual patterns.

Referring to FIG. 1, a size of each of the plurality of second plate patterns 123 may be larger than a size of each of the plurality of first plate patterns 121. In each of the plurality of second plate patterns 123, one stage of the gate driver GD may be disposed. Therefore, an area occupied by various circuit configurations which configure one stage of the gate driver GD may be relatively larger than an area occupied by one pixel PX so that a size of at least some of the plurality of second plate patterns 123 may be larger than a size of each of the plurality of first plate patterns 121.

In the meantime, even though it is illustrated in FIG. 1 that the plurality of second plate patterns 123 is disposed in the non-active area NA on both sides of the active area AA in the first direction X, this is illustrative so that the plurality of second plate patterns 123 may be disposed in an arbitrary area of the non-active area NA. Further, even though it is illustrated that the plurality of first plate patterns 121 and the plurality of second plate patterns 123 have a square shape, it is not limited thereto and the shapes of the plurality of first plate patterns 121 and the plurality of second plate patterns 123 may vary in various forms.

Referring to FIGS. 1 and 2, the plurality of first line patterns 122 of the pattern layer 120 is disposed in the active area AA. The plurality of first line patterns 122 is patterns which connect the plurality of first plate patterns 121 which are adjacent to each other and may be referred to as internal connection patterns. That is, the plurality of first line patterns 122 may be disposed between the plurality of first plate patterns 121.

The plurality of second line patterns 124 of the pattern layer 120 is disposed in the non-active area NA. The plurality of second line patterns 124 connects the first plate pattern 121 and the second plate pattern 123 which are adjacent to each other or connects a plurality of adjacent second plate patterns 123 and may be referred to as external connection patterns. The plurality of second line patterns 124 may be disposed between the first plate pattern 121 and the second plate pattern 123 which are adjacent to each other and between the plurality of second plate patterns 123 which is adjacent to each other.

The plurality of first line patterns 122 and the plurality of second line patterns 124 have a wavy shape. For example, the plurality of first line patterns 122 and the plurality of second line patterns 124 may have a sinusoidal shape. However, the shape of the plurality of first line patterns 122 and the plurality of second line patterns 124 is not limited thereto. For example, the plurality of first line patterns 122 and the plurality of second line patterns 124 may extend in a zigzag pattern. Further, the plurality of first line patterns 122 and the plurality of second line patterns 124 may have various shapes such as a plurality of rhombic substrates which is connected at their vertexes to be extended. Further, the number and the shape of the plurality of first line patterns 122 and the plurality of second line patterns 124 illustrated in FIG. 1 are examples and may be changed in various forms depending on the design.

In the meantime, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be more rigid than the lower substrate 111 and the upper substrate 112.

The plurality of first plate patterns 121, the plurality of first line patterns 122, the plurality of second plate patterns 123, and the plurality of second line patterns 124 which are a plurality of rigid substrates may be formed of a plastic material having a lower flexibility than the lower substrate 111 and the upper substrate 112. For example, the plurality of first plate patterns 121, the plurality of first line patterns 122, the plurality of second plate patterns 123, and the plurality of second line patterns 124 may be formed of at least one material of polyimide (PI), polyacrylate, and polyacetate. At this time, the plurality of first plate patterns 121, the plurality of first line patterns 122, the plurality of second plate patterns 123, and the plurality of second line patterns 124 may be formed of the same material, but is not limited thereto and may be formed of different materials. When the plurality of first plate patterns 121, the plurality of first line patterns 122, the plurality of second plate patterns 123, and the plurality of second line patterns 124 are formed of the same material, the patterns may be integrally formed.

In this case, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but it is not limited thereto.

In the meantime, in some example embodiments, the lower substrate 111 may include a plurality of first lower patterns and a second lower pattern. The plurality of first lower patterns may be an area of the lower substrate 111 overlapping the plurality of first plate patterns 121 and the plurality of second patterns 123. The second lower pattern may be a remaining area which does not overlap the plurality of first plate patterns 121 and the plurality of second patterns 123.

Further, the upper substrate 112 may include a plurality of first upper patterns and a second upper pattern. The plurality of first upper patterns may be an area of the upper substrate 112 overlapping the plurality of the first plate patterns 121 and the plurality of second plate patterns 123, but the second upper pattern may be a remaining area which does not overlap the plurality of the first plate patterns 121 and the plurality of second plate patterns 123.

At this time, moduli of elasticity of the plurality of first lower patterns and the plurality of the first upper patterns may be higher than moduli of elasticity of the second lower pattern and the second upper pattern. For example, the plurality of first lower patterns and the plurality of the first upper patterns may be formed of the same material as the plurality of first plate patterns 121 and the plurality of second plate patterns 123. The second lower pattern and the second upper pattern may be formed of a material having a modulus of elasticity lower than those of the plurality of first plate patterns 121 and the plurality of second plate patterns 123.

For example, the first lower pattern and the first upper pattern may be formed of polyimide (PI), polyacrylate, or polyacetate. Further, the second lower pattern and the second upper pattern may be formed of silicon rubber such as polydimethylsiloxane (PDMS) or elastomer such as polyurethane (PU) or polytetrafluoroethylene.

The gate driver GD may be mounted on the plurality of second plate patterns 123. The gate driver GD may be formed on the plurality of second plate patterns 123 in a gate in panel (GIP) manner when various elements on the plurality of first plate patterns 121 are manufactured. Therefore, various circuit configurations which configure the gate driver GD, such as transistors, capacitors, and wiring lines, may be disposed on the plurality of second plate patterns 123. One stage which is a circuit which configures the gate driver GD and includes transistors, capacitors, and the like may be disposed above each of the plurality of second plate patterns 123. However, the gate driver GD may be mounted in a chip on film (COF) manner, but is not limited thereto.

The power supply PS may be disposed on the plurality of second plate patterns 123. The power supply PS may be formed on the second plate pattern 123 adjacent to the gate driver GD. The power supply PS is a plurality of power blocks patterned when various components on the first plate pattern 121 are manufactured and may be formed on the second plate pattern 123. The power supply PS is electrically connected to the gate driver GD of the non-active area NA and the plurality of pixels PX of the active area AA to supply a driving voltage. Specifically, the power supply PS may be electrically connected to the gate driver GD formed on the second plate pattern 123 and the plurality of pixels PX formed on the first plate pattern 121 by means of the connection line 180 on the second line pattern 124 and the first line pattern 122. For example, the power supply PS may supply a gate driving voltage and a clock signal to the gate driver GD. The power supply PS may supply the power voltage to each of the plurality of pixels PX.

The printed circuit board PCB is connected to the edge of the lower substrate 111. The printed circuit board PCB is a component which transmits signals and voltages for driving the display element from a control unit or controller to the display element. Therefore, the printed circuit board PCB may also be referred to as a driving substrate. A control unit or controller such as an IC chip or a circuit unit or circuit may be mounted on the printed circuit board PCB. Further, on the printed circuit board PCB, a memory or a processor may also be mounted. The printed circuit board PCB provided in the display device 100 may include a stretching area and a non-stretching area to ensure stretchability. In the non-stretching area, an IC chip, a circuit unit or circuit, a memory, a processor, and the like may be mounted. In the stretching area, wiring lines which are electrically connected to the IC chip, the circuit unit or circuit, the memory, and the processor may be disposed.

The data driver DD is a component which supplies a data voltage to the plurality of pixels PX disposed in the active area AA. The data driver DD is configured as an IC chip so that it may be also referred to as a data integrated circuit D-IC. The data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a COB manner, the data driver DD may be mounted by a chip on film (COF), a chip on glass (COG), or a tape carrier package (TCP) manner, but it is not limited thereto.

Further, even though in FIG. 1, one data driver DD is disposed so as to correspond to each of a plurality of columns formed by the plurality of first plate patterns 121 disposed in the active area AA, it is not limited thereto. That is, one data driver DD may be disposed so as to correspond to a plurality of columns formed by first plate patterns 121.

Referring to FIGS. 2 and 3, the plurality of first plate patterns 121 is disposed on the lower substrate 111 in the active area AA. The plurality of first plate patterns 121 is spaced apart from each other to be disposed on the lower substrate 111. For example, as illustrated in FIG. 1, the plurality of first plate patterns 121 may be disposed on the lower substrate 111 in a matrix, but is not limited thereto.

A pixel PX including the plurality of sub pixels SPX is disposed in the first plate pattern 121. Each sub pixel SPX may include an LED 170 which is a display element and a driving transistor 160 and a switching transistor 150 which drive the LED 170. However, in the sub pixel SPX, the display element is not limited to an LED 170, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to a plurality of connection lines 180. That is, the plurality of sub pixels SPX may be electrically connected to a first connection line 181 extending in the first direction X. The plurality of sub pixels SPX may be electrically connected to the second connection line 182 extending in the second direction Y. Finally, the plurality of sub pixels SPX may be electrically connected to a third connection line 183 which extends in a direction different from the first direction X and the second direction Y, for example, a diagonal direction between the first direction X and the second direction Y.

Referring to FIG. 3, a plurality of inorganic insulating layers is disposed on the plurality of first plate patterns 121. For example, the plurality of inorganic insulating layers may include a buffer layer 141, a gate insulating layer 142, a first interlayer insulating layer 143, a second interlayer insulating layer 144, and a passivation layer 145, but is not limited thereto. Therefore, on the plurality of first plate patterns 121, various inorganic insulating layers may be additionally disposed or one or more of the buffer layer 141, the gate insulating layer 142, the first interlayer insulating layer 143, the second interlayer insulating layer 144, and the passivation layer 145 may be omitted.

First, the buffer layer 141 is disposed on the plurality of first plate patterns 121. The buffer layer 141 is formed on the plurality of first plate patterns 121 to protect various components of the display device 100 from permeation of moisture ($H_2O$) and oxygen ($O_2$) from the outside of the lower substrate 111 and the plurality of first plate patterns 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

At this time, the buffer layer 141 may be formed only in an area where the lower substrate 111 overlaps the plurality of first plate patterns 121 and the plurality of second plate patterns 123. As described above, the buffer layer 141 may be formed of an inorganic material so that the buffer layer 141 may be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the example embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage to various components of the display device 100 may be suppressed.

Referring to FIG. 4, a switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, referring to FIG. 3, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be formed of an oxide semiconductor. Alternatively, the active layer 152 of the switching transistor 150 and the active layer 162 of the driving transistor 160 may be formed of amorphous silicon (a-Si), polycrystalline silicon (poly-Si), or an organic semiconductor.

The gate insulating layer 142 is disposed on the active layer 152 of the switching transistor 150 and the active layer 162 of the driving transistor 160. The gate insulating layer 142 is a layer which electrically insulates the gate electrode 151 of the switching transistor 150 from the active layer 152 of the switching transistor 150 and electrically insulates the gate electrode 161 of the driving transistor 160 from the active layer 162 of the driving transistor 160. The gate insulating layer 142 may be formed of an insulating material. For example, the gate insulating layer 142 may be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. The gate electrode 151 of the switching transistor 150 overlaps the active layer 152 of the switching transistor 150 and the gate electrode 161 of the driving transistor 160 overlaps the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may be formed of an inorganic material, similar to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM is disposed on the first interlayer insulating layer 143. The intermediate metal layer IM overlaps the gate electrode 161 of the driving transistor 160. Therefore, a storage capacitor Cst is formed in an overlapping area of the intermediate metal layer IM and the gate electrode 161 of the driving transistor 160. Specifically, the gate electrode 161 of the driving transistor 160, the first interlayer insulating layer 143, and the intermediate metal layer IM form the storage capacitor. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. The second interlayer insulating layer 144 insulates the intermediate metal layer 1M from the source electrode and the drain electrode 164 of the driving transistor 160. The second interlayer insulating layer 144 may be formed of an inorganic material, similar to the buffer layer 141. For example, the second interlayer insulating layer 144 may be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 are disposed on the second interlayer insulating layer 144. The source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Even though in FIG. 2, the source electrode of the driving transistor 160 is omitted, the source electrode of the driving transistor 160 is also disposed to be spaced apart from the drain electrode 164 on the same layer. In the switching transistor 150, the source electrode 153 and the drain electrode 154 may be in contact with the active layer 152 to be electrically connected to the active layer 152. In the driving transistor 160, the source electrode and the drain electrode 164 may be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure may also be used. In the present specification, the transistor may also be formed with a bottom gate structure, instead of the top gate structure, but is not limited thereto.

Referring to FIGS. 3 and 4, a plurality of pads PD1, PD2, and PD3 are disposed on the second interlayer insulating layer 144. The plurality of pads PD1, PD2, and PD3 includes a first pad PD1, a second pad PD2, and a third pad PD3. The plurality of pads PD1, PD2, and PD3 may transmit various voltages transmitted from the plurality of connection lines 180 to the plurality of lines and sub pixels SPX disposed on the first plate pattern 121.

For example, the first pad PD1 is a pad which transmits a scan signal to the plurality of sub pixels SPX. The first pad PD1 is connected to the first connection line 181 through a contact hole. The first pad PD1 may be disposed to be adjacent to a left edge and a right edge of the first plate pattern 121. A scan signal SCAN supplied from the first connection line 181 may be transmitted to the gate electrode 151 of the switching transistor 150 by means of a wiring line on the first pad PD1 and the first plate pattern 121 connected to the first pad PD1.

For example, the second pad PD2 is a pad which transmits a data voltage to the plurality of sub pixels SPX. The second pad PD2 is connected to the second connection line 182 through a contact hole. The second pad PD2 may be disposed to be adjacent to an upper edge and a lower edge of the first plate pattern 121. A data voltage supplied from the second connection line 182 may be transmitted to the source electrode 153 or the drain electrode of the switching transistor 150 by means of a wiring line on the second pad PD2 and the first plate pattern 121 connected to the second pad PD2.

For example, the third pad PD3 is a pad which transmits a high potential power voltage to the plurality of sub pixels SPX. The third pad PD3 is connected to some of the plurality of third connection lines 183 through the contact hole. The third pad PD3 may be disposed to be adjacent to four corners of the first plate pattern 121. The high potential power voltage supplied from the third connection line 183 may be transmitted to the source electrode or the drain electrode of the driving transistor 160 by means of a wiring line on the third pad PD3 and the first plate pattern 121 connected to the third pad PD3.

The first pad PD1, the second pad PD2, and the third pad PD3 may be formed of the same material as the source electrode 153 and the drain electrodes 154 and 164, but are not limited thereto.

Referring to FIG. 3, the passivation layer 145 is formed on the switching transistor 150 and the driving transistor 160. That is, the passivation layer 145 may cover the switching transistor 150 and the driving transistor 160 to protect the switching transistor 150 and the driving transistor 160 from the permeation of moisture and oxygen. The passivation layer 145 may be formed of an inorganic material and configured by a single layer or a double layer, but is not limited thereto.

In the meantime, the gate insulating layer 142, the first interlayer insulating layer 143, the second interlayer insulating layer 144, and the passivation layer 145 are patterned to be formed only in an area overlapping the plurality of first plate patterns 121. The gate insulating layer 142, the first interlayer insulating layer 143, the second interlayer insulating layer 144, and the passivation layer 145 may be also formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of first plate patterns 121. However, the gate insulating layer 142, the first interlayer insulating layer 143, the second interlayer insulating layer 144, and the passivation layer 145 are patterned to have a shape of the plurality of first plate patterns 121 to be formed only above the plurality of first plate patterns 121.

The planarization layer 146 is formed on the passivation layer 145. The planarization layer 146 planarizes upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 3, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of first plate patterns 121. The planarization layer 146 encloses the buffer layer 141, the gate insulating layer 142, the first interlayer insulating layer 143, the second interlayer insulating layer 144, and the passivation layer 145 together with the plurality of first plate patterns 121. Specifically, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of first plate patterns 121.

An inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Accordingly, the planarization layer 146 may supplement a step on side surfaces of the buffer layer 141, the gate insulating layer 142, the first interlayer insulating layer 143, the second interlayer insulating layer 144, and the passivation layer 145. Therefore, the connection line 180 which is disposed to be in contact with the side surface of the planarization layer 146 is disposed with a gentle slope so that when the display device 100 is stretched, the stress generated in the connection line 180 may be reduced. Further, the side surface of the planarization layer 146 has a relatively gentle slope so that the crack of the connection line 180 or separation thereof from the side surface of the planarization layer 146 may be suppressed.

In the case of a general display device, various wiring lines such as a plurality of scan lines and a plurality of data lines extend between the plurality of sub pixels with a linear shape and the plurality of sub pixels is connected to one line. Therefore, in the general display device, various wiring lines such as a scan line, a data line, a high potential power line, and a reference line may extend from one side to the other side of the display device without being disconnected on the substrate.

In contrast, in the display device 100 according to the example embodiment of the present disclosure, various wiring lines, such as a scan line, a data line, a high potential power line, or a reference line having a linear shape which are considered to be used for the general display device, may be disposed only on the plurality of first plate patterns 121 and the plurality of second plate patterns 123. That is, in the display device 100 according to the example embodiment of the present disclosure, a linear wiring line is disposed only on the plurality of first plate patterns 121 and the plurality of second plate patterns 123.

In the display device 100 according to the example embodiment of the present disclosure, the plurality of pads PD1, PD2, and PD3 on the two adjacent first plate patterns 121 may be connected by the connection lines 180. Accordingly, various wiring lines on the first plate patterns 121 which are adjacent to each other may be electrically connected to each other through the plurality of pads PD1, PD2, and PD3 and the plurality of connection lines 180. Accordingly, the display device 100 according to the example embodiment of the present disclosure may include a plurality of connection lines 180 to electrically connect various wiring lines, such as a scan line, a data line, a high potential power line, and a reference line, between the plurality of first plate patterns 121. For example, the data line may be disposed on the plurality of first plate patterns 121 and the second pads PD2 may be disposed on both ends of the data line. In this case, each of the plurality of second pads PD2 on the plurality of first plate patterns 121 adjacent to each other in the second direction Y may be connected to each other by the connection line 180 which serves as a data line. Therefore, the data line disposed on the plurality of first plate patterns 121 and the connection line 180 disposed on the first line pattern 122 may serve as one data line. Further, in addition to the data line, all various lines which may be included in the display device 100, for example, the scan line, the emission control line, the low potential power line, the high potential power line, and the reference line may be electrically connected by the connection line 180 as described above.

Specifically, the connection line 180 is disposed on the plurality of first line patterns 122. The connection line 180 may electrically connect pads on the first plate patterns 121 which are adjacent to each other. The connection line 180 may extend to the upper portion of the first plate pattern 121 from the first line pattern 122 to be electrically connected to the pad on the first plate pattern 121.

The plurality of connection lines 180 may include a plurality of first connection lines 181, a plurality of second connection lines 182, and a plurality of third connection lines 183.

The plurality of first connection lines 181 extends in the first direction X between the plurality of first plate patterns 121 and electrically connects the plurality of lines disposed on the plurality of first plate patterns 121. The first connection line 181 is disposed on the first line pattern 122 extending in the first direction X between the plurality of first plate patterns 121, among the plurality of first line patterns 122. The first connection line 181 extends to the upper portion of the first plate pattern 121 from the first line pattern 122 to be connected to any one of the plurality of pads on the first plate pattern 121. For example, the first connection line 181 is connected to the plurality of first pads PD1 on the first plate pattern 121 to electrically connect the scan line, the emission control line, the reference line, and the like on one pair of first plate patterns 121 which are adjacent to each other and may serve as the scan line, the emission control line, and the reference line, and the like. However, it is not limited thereto.

The second connection lines 182 are lines which extend in the second direction Y between the plurality of first plate patterns 121 and electrically connects the plurality of lines disposed on the plurality of first plate patterns 121. The second connection line 182 is disposed on the first line pattern 122 extending in the second direction Y between the plurality of first plate patterns 121, among the plurality of first line patterns 122. The second connection line 182 extends to the upper portion of the first plate pattern 121 from the first line pattern 122 to be connected to any one of the plurality of pads on the first plate pattern 121. For example, the second connection line 182 is connected to the plurality of second pads PD2 on the first plate pattern 121 to electrically connect the data line on one pair of first plate patterns 121 which are adjacent to each other and serves as the data line, but it is not limited thereto.

The third connection lines 183 are lines which extend in a direction which is different from the first direction X and the second direction Y, for example, an inclined direction, between the plurality of first plate patterns 121 and electrically connects the plurality of lines disposed on the plurality of first plate patterns 121. The third connection line 183 may extend from any one of four corners of the first plate pattern 121 in a diagonal direction between the first direction X and the second direction Y. For example, the third connection line 183 connected to a right upper corner of the first plate pattern 121 may extend in the diagonal direction between the right side and the upper side of the first plate pattern 121.

The third connection line 183 is disposed on the first line pattern 122 extending in a direction which is different from the first direction X and the second direction Y, between the plurality of first plate patterns 121, among the plurality of first line patterns 122. The first line pattern 122 on which the plurality of third connection lines 183 is disposed may be formed in an X-shape. The third connection line 183 extends to the upper portion of the first plate pattern 121 from the first line pattern 122 to be connected to any one of the plurality of third pads PD3 on the first plate pattern 121. Further, the third connection line 183 is not connected to the plurality of pads, but may extend to the upper portion of the first plate pattern 121 to be integrally formed with the plurality of lines. For example, some of the third connection lines 183 are connected to the third pad PD3 on the first plate pattern 121 to electrically connect the high potential power lines on four first plate patterns 121 which are opposite to each other. As another example, the other parts of the third connection lines 183 extend to the upper portion of four first plate patterns 121 which are adjacent to each other to be integrally formed with the low potential power line and electrically connect the low potential power lines on four first plate patterns 121 which are adjacent to each other.

In the meantime, the third connection line 183 extending from one corner of the first plate pattern 121 is connected to the third connection lines 183 extending from an adjacent first plate pattern 121 to form an X-shape. For example, the third connection line 183 extending from the corner of each of the four first plate patterns 121 which are disposed in a 2×2 matrix and are adjacent to each other is connected to a contact unit or contact area 183*a* and may be electrically connected to the other third connection line 183. The contact unit 183*a* is a pattern connected to four third connection lines 183 and may be formed in various shapes, such as a rectangular or a circle. The contact unit 183*a* is disposed in an intermediate area between four first plate patterns 121 which form a 2×2 matrix and may be connected to four third connection lines 183. For example, as illustrated in FIG. 2, when the contact unit 183*a* is formed in a rectangular shape, each of the third connection lines 183 extending from four adjacent first plate patterns 121 may be connected to each of four sides of the contact unit 183*a*. However, the contact unit 183*a* may be configured with various shapes, but is not limited thereto.

The plurality of connection lines 180 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

As illustrated in FIGS. 3 and 4, the first connection line 181 extends from a top surface of the first line pattern 122 to an upper portion of the first plate pattern 121 to be in contact with a top surface and a side surface of the planarization layer 146 on the first plate pattern 121. The second connection line 182 and the third connection line 183 also extend from the first line pattern 122 to the upper portion of the first plate pattern 121 to be in contact with the top surface and the side surface of the planarization layer 146 on the first plate pattern 121.

However, in an area in which the plurality of connection lines 180 is not disposed, it is not necessary to dispose a rigid pattern so that the first line pattern 122 which is a rigid pattern is not disposed below the plurality of connection lines 180.

A connection pad CP is disposed on the planarization layer 146. The connection pad CP is a pad for electrically connecting the LED 170 to the driving transistor 160 and the low potential power line. The connection pad CP includes a first connection pad CP1 and a second connection pad CP2. The first connection pad CP1 may electrically connect the drain electrode 164 of the driving transistor 160 and a p-electrode 175 of the LED 170 and the second connection pad CP2 may electrically connect the low potential power line and a n-electrode 174 of the LED 170. In this case, a third connection line 183 which transmits a low potential power voltage, among the plurality of third connection lines 183, may be integrally formed with the second connection pad CP2. Therefore, when the display device 100 is driven, different voltage levels applied to the first connection pad CP1 and the second connection pad CP2 are transmitted to the n-electrode 174 and the p-electrode 175 so that the LED 170 emits light.

A bank 147 is formed on the connection pad CP, the connection line 180, and the planarization layer 146. The bank 147 is a component which divides adjacent sub pixels SPX. The bank 147 is disposed so as to cover at least a part of the connection pad CP, the connection line 180, and the planarization layer 146. The bank 147 may be formed of an insulating material. Further, the bank 147 may include a black material. The bank 147 includes the black material to block wiring lines which may be visible through the active area AA. For example, the bank 147 may be formed of a transparent carbon-based mixture and specifically, include carbon black. However, it is not limited thereto and the bank 147 may be formed of a transparent insulating material. Even though in FIG. 3, it is illustrated that a height of the bank 147 is lower than a height of the LED 170, the present disclosure is not limited thereto and the height of the bank 147 may be equal to the height of the LED 170.

Referring to FIG. 3, the LED 170 is disposed on the connection pad CP. The LED 170 includes an n-type layer 171, an active layer 172, a p-type layer 173, an n-electrode 174, and a p-electrode 175. The LED 170 of the display device 100 according to the example embodiment of the present disclosure has a flip-chip structure in which the n-electrode 174 and the p-electrode 175 are formed together on one surface.

A p-type layer 173 is disposed on the connection pad CP and the n-type layer 171 is disposed on the p-type layer 173. The n-type layer 171 and the p-type layer 173 may be formed by doping n-type and p-type impurities into a specific material. For example, each of the n-type layer 171 and the p-type layer 173 may be layers formed by doping n type and p type impurities into a material such as gallium nitride (GaN), indium aluminum phosphide (InAlP), or gallium arsenide (GaAs). The p-type impurity may be magnesium (Mg), zinc (Zn), beryllium (Be), and the like, and the n-type impurity may be silicon (Si), germanium, tin (Sn), and the like, but are not limited thereto.

An active layer 172 is disposed between the n-type layer 171 and the p-type layer 173. The active layer 172 is an emission layer of the LED 170 which emits light and may be formed by a single layer or a multi-quantum well (MQW)

structure, and for example, may be formed of indium gallium nitride (InGaN), gallium nitride (GaN), or the like, but is not limited thereto.

As described above, the LED 170 of the display device 100 according to the example embodiment of the present disclosure may be manufactured by sequentially laminating the n-type layer 171, the active layer 172, and the p-type layer 173, and then etching a predetermined or selected part to form the n-electrode 174 and the p-electrode 175. In this case, the predetermined or selected part which is a space for separating the n-electrode 174 and the p-electrode 175 from each other may be etched to expose a part of the n-type layer 171. In other words, the surfaces of the LED 170 on which the n-electrode 174 and the p-electrode 175 are disposed are not flat surfaces, but have different heights.

As described above, the n-electrode 174 may be disposed on one surface of the exposed n-type layer 171 in the etched area. Further, the p-electrode 175 may be disposed on one surface of the p-type layer 173 disposed in an unetched area.

An adhesive pattern AD is disposed between the LED 170 and the connection pad CP. The adhesive pattern AD may be disposed between the n-electrode 174 and the p-electrode 175 of the LED 170 and the connection pad CP. The adhesive pattern AD may be a conductive adhesive pattern AD in which conductive balls are dispersed in an insulating base member. Therefore, when heat or a pressure is applied to the adhesive pattern AD, the conductive balls are electrically connected in a portion applied with the heat or pressure to have a conductive property and an area which is not pressurized may have an insulation property. The n-electrode 174 and the p-electrode 175 may be electrically connected to the connection pad CP by means of the adhesive pattern AD. For example, after applying the adhesive pattern AD on the connection pad CP in an inkjet method, the LED 170 is transferred onto the adhesive pattern AD and the LED 170 is pressurized and heated to electrically connect the connection pad CP and the p-electrode 175 and the n-electrode 174. However, a part of the adhesive pattern AD excluding a part of the adhesive pattern AD disposed between the n-electrode 174 and the connection pad CP and a part of the adhesive pattern AD disposed between the p-electrode 175 and the connection pad CP has an insulating property. Even though in FIG. 3, it is illustrated that the adhesive patterns AD which cover one pair of connection pads CP are connected to each other, the adhesive pattern AD may be separated to be disposed in each of the pair of connection pads CP.

The upper substrate 112 is disposed on the plurality of first plate patterns 121 in which the plurality of LEDs 170 is formed and the plurality of first line patterns 122 in which the plurality of connection lines 180 is formed. The upper substrate 112 may be formed by coating and then curing a material which configures the upper substrate 112 on the lower substrate 111 and the first plate pattern 121.

A filling layer 190 is disposed on the entire surface of the lower substrate 111 to be filled between the upper substrate 112 and the lower substrate 111. The filling layer 190 may be configured by a curable adhesive. Specifically, the material which configures the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may be configured by an acrylic adhesive, a silicon-based adhesive, a urethane-based adhesive, and the like.

Even though not illustrated in FIG. 3, a polarization layer may be further disposed on the upper substrate 112. The polarization layer may perform a function which polarizes light incident from the outside of the display device 100 to reduce the external light reflection. Further, an optical film other than the polarization layer may be disposed on the upper substrate 112.

In the meantime, according to the related art, only a connection line extending in the first direction and the second direction in an area between the first plate patterns is disposed and an area in a diagonal area of the first plate pattern is formed as an empty space. In this case, the connection line is disposed only in an area between the first plate patterns in the first direction and an area between the first plate patterns in the second direction so that it is not easy to ensure the number of the connection lines and an area thereof in a limited area.

Accordingly, in the display device 100 according to the example embodiment of the present disclosure, the plurality of connection lines 180 may be further formed in an area between the first plate patterns 121 in a diagonal direction which is different from the first direction X and the second direction Y. That is, the connection lines 180 are disposed in all the upper and lower spaces, left and right spaces, and a space in a diagonal direction of the first plate pattern 121 to ensure a design area of the connection line 180. Accordingly, in the diagonal direction, the area between the first plate patterns 121 is utilized to improve the number and the area of connection lines 180.

Further, as the area in which the connection line 180 can be designed is increased, a ratio of the entire length to the entire width of one connection line 180 may be increased. That is, the stretching rate of the connection line 180 may be improved by increasing the entire length of the connection line 180 and the stretchability of the display device 100 may be improved.

In the meantime, in the related art, the first line pattern and the first plate pattern may be formed by forming and patterning a material for the pattern layer on the entire lower substrate. At this time, in the display device of the related art in which the first line pattern and the first connection pattern are disposed only in upper, lower, left, and right areas of the first plate pattern and an area in the diagonal direction of the first plate pattern is formed as an empty space, the material for the pattern layer is entirely etched in an area in the diagonal direction of the first plate pattern and the material for the pattern layer is partially etched in the upper, lower, left and right areas of the first plate pattern to form the first line pattern. In this case, the material for the pattern layer needs to be entirely etched in an area between the first plate patterns in the diagonal direction of the first plate pattern so that a longer etching time may be necessary than the etching time in the upper, lower, left, and right areas of the first plate pattern in the area in the diagonal direction of the first plate pattern. That is, the etching time difference in the diagonal direction and the upper, lower, left, and right areas of the first plate pattern occurs and the first line pattern may be over-etched in the upper, lower, left, and right areas of the first plate pattern having a relatively shorter etching time.

Therefore, in the display device 100 according to the example embodiment of the present disclosure, the plurality of connection lines 180 and the plurality of first line patterns 122 are entirely disposed in a space in the vicinity of the plurality of first plate patterns 121 to reduce the etching time difference and minimize or reduce the over-etching of the plurality of first line patterns 122. The first line pattern 122 is uniformly formed in all the upper, lower, left, and right areas and the diagonal area of the first plate pattern 121 so that the etching time of the material for the pattern layer 120 in the upper, lower, left, and right areas and the diagonal area may be implemented at a similar level. Therefore, in each of the upper, lower, left, and right areas and the diagonal area of the first plate pattern 121, an etching time difference for forming the first line pattern 122 may be minimized or reduced. Accordingly, the etching time difference is minimized or reduced to suppress the over-etching of any one of the first line pattern 122 extending in the first direction X, the first line pattern 122 extending in the second direction Y, and the first line pattern 122 extending in a direction different from the first direction X and the second direction Y.

In the meantime, in the display device 100 according to the example embodiment of the present disclosure, the third connection line 183 is disposed in an area between the first plate patterns 121 in the diagonal direction to connect the first plate patterns 121 disposed in one pair of adjacent rows. Therefore, the third connection line 183 is used to reduce the resistance of the high potential power line and the low potential power line. For example, the high potential power lines on the first plate patterns 121 disposed in two adjacent rows may be connected by the third connection line 183. Therefore, the high potential power lines in one pair of adjacent rows are connected in a meshed shape by the third connection line 183 so that the entire area of the high potential power line may be increased. Similarly, the third connection line 183 may electrically connect the low potential power lines on the first plate patterns 121 disposed in two adjacent rows and thus the entire area of the low potential power line may be increased. Accordingly, the third connection line 183 which connects the high potential power line and the low potential power line on the first plate patterns 121 on one pair of adjacent rows is formed to connect the high potential power line and the low potential power line in a meshed pattern. Further, the third connection line may reduce the resistance of the high potential power line and the low potential power line.

Hereinafter, a connection relationship of the sub pixel SPX and the third connection line 183 of the display device 100 according to the example embodiment of the present disclosure will be described in more detail with reference to FIGS. 6 to 8.

Figure 6:
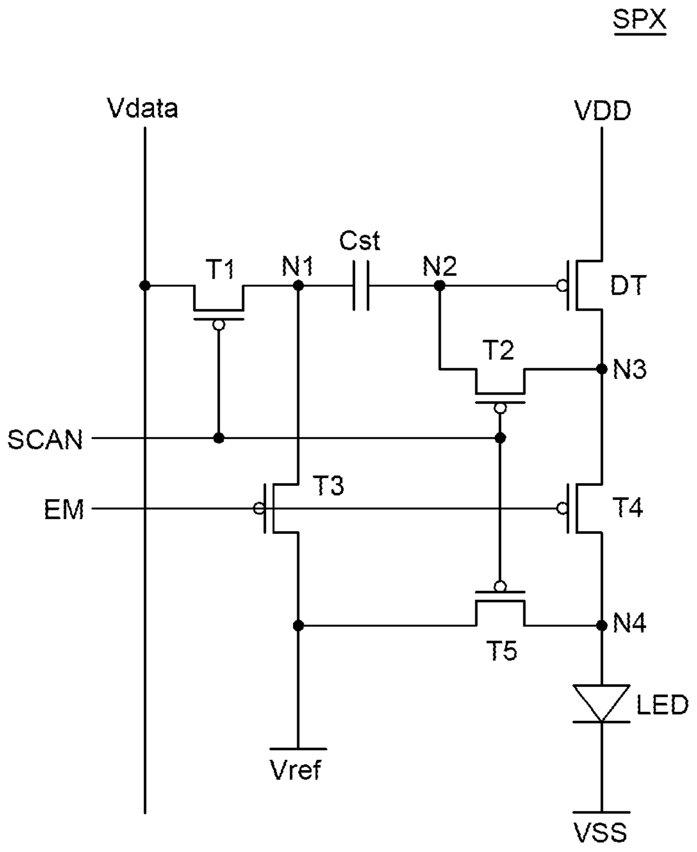
FIG. 6 is a circuit diagram of a sub pixel of a display device according to an example embodiment of the present disclosure.

FIG. 6 is a circuit diagram of a sub pixel of a display device according to an example embodiment of the present disclosure. FIGS. 7 and 8 are enlarged plan views of a display device according to an example embodiment of the present disclosure. Specifically, FIG. 7 is an enlarged plan view of a 1-1-th plate pattern 121*a*, among a plurality of first plate patterns 121 of the display device 100 according to an example embodiment of the present disclosure. FIG. 8 is an enlarged plan view of a 1-2-th plate pattern 121*b*, among a plurality of first plate patterns 121 of the display device 100 according to an example embodiment of the present disclosure.

First, referring to FIG. 6, each of the plurality of sub pixels SPX of the display device 100 according to the example embodiment of the present disclosure includes a first transistor T1, a second transistor T2, a third transistor T3, a fourth transistor T4, a fifth transistor T5, a driving transistor 160, a storage capacitor Cst, and a light emitting diode LED.

At this time, the switching transistor 150 which is illustrated in FIG. 3 may correspond to the first transistor T1 of FIG. 6, the driving transistor 160 which is illustrated in FIG. 3 may correspond to the driving transistor DT of FIG. 6 and the LED 170 which is illustrated in FIG. 3 may correspond to the light emitting diode LED of FIG. 6.

First, the light emitting diode LED of each of the plurality of sub pixels SPX emits light by a driving current supplied from the driving transistor DT. An anode electrode of the light emitting diode LED is connected to a fourth anode N4 which is the fourth transistor T4 and the fifth transistor T5 and a cathode electrode of the light emitting diode LED is connected to the low potential power line to which a low potential power voltage VSS is applied.

The driving transistor DT of each of the plurality of sub pixels SPX supplies a driving current to the light emitting diode LED according to a gate-source voltage. A source electrode of the driving transistor DT is connected to the high potential power line to which the high potential power voltage VDD is applied, a gate electrode is connected to a second node N2, and a drain electrode is connected to a third node N3.

The first transistor T1 of each of the plurality of sub pixels SPX applies a data voltage Vdata supplied from the data line to the first node N1. The first transistor T1 includes a source electrode connected to the data line, a drain electrode connected to the first node N1, and a gate electrode connected to a scan line which transmits a scan signal SCAN. Accordingly, the first transistor T1 applies a data voltage Vdata supplied from the data line to the first node N1, in response to a low level of scan signal SCAN which is a turn-on level. That is, the first transistor T1 may be a switching transistor 150 which applies any one of the plurality of data voltages Vdata to each of the plurality of pixel PX circuits in response to the scan signal SCAN.

The second transistor T2 of each of the plurality of sub pixels SPX forms a diode connection with a gate electrode and a drain electrode of the driving transistor DT. The second transistor T2 includes a source electrode connected to a third node N3 which is the drain electrode of the driving transistor DT, a drain electrode connected to the second node N2 which is the gate electrode of the driving transistor DT, and a gate electrode which is connected to a scan line transmitting the scan signal SCAN. Therefore, the second transistor T2 forms a diode connection with the gate electrode and the drain electrode of the driving transistor DT in response to a low level of scan signal SCAN which is a turn-on level.

The third transistor T3 of each of the plurality of sub pixels SPX applies a reference voltage Vref to the first node N1. The third transistor T3 includes a source electrode which is connected to the reference line transmitting the reference voltage Vref, a drain electrode which is connected to the first node N1, and a gate electrode which is connected to the emission control line transmitting an emission signal. Accordingly, the third transistor T3 applies the reference voltage Vref to the first node N1 in response to a low level of emission control signal EM which is a turn on level.

The fourth transistor T4 of each of the plurality of sub pixels SPX forms a current path between the driving transistor DT and the light emitting diode LED. The fourth transistor T4 includes a source electrode which is connected to the third node N3 which is the drain electrode of the driving transistor DT, a drain electrode which is connected to the light emitting diode LED, and a gate electrode which is connected to the emission control line transmitting an emission signal. Therefore, the fourth transistor T4 may be an emission control transistor which forms a current path between the drain electrode of the driving transistor DT and the light emitting diode LED in response to the emission signal.

The fifth transistor T5 of each of the plurality of sub pixels SPX applies a reference voltage Vref to the anode electrode of the light emitting diode LED. The fifth transistor T5 includes a source electrode which is connected to the reference line transmitting the reference voltage Vref, a drain electrode which is connected to the anode electrode of the light emitting diode LED, and a gate electrode which is connected to the scan line transmitting the scan signal SCAN. Therefore, the fifth transistor T5 applies the reference voltage Vref to the anode electrode of the light emitting diode LED in response to the low level of scan signal SCAN which is a turn on level. The fifth transistor T5 may be an initialization transistor which applies the reference voltage Vref to the anode electrode of the light emitting diode LED.

The storage capacitor Cst of each of the plurality of sub pixels PX includes a first electrode connected to the first node N1 and a second electrode connected to the second node N2. That is, one electrode of the storage capacitor Cst is connected to the gate electrode of the driving transistor DT and the other electrode of the storage capacitor Cst is connected to the drain electrode of the first transistor T1.

In the meantime, the high potential power voltage VDD and the low potential power voltage VSS may be commonly applied to each of the plurality of sub pixels SPX on the first plate pattern 121. Therefore, the high potential power lines which are disposed in each of the plurality of first plate patterns 121 are electrically connected to each other or the low potential power lines are electrically connected to reduce the resistances of the high potential power lines and the lower potential power lines and minimize or reduce the luminance irregularity. In this case, in the display device 100 according to the example embodiment of the present disclosure, the third connection line 183 connected to the first plate pattern 121 of the adjacent row is used to connect the high potential power lines or the low potential power lines on the first plate patterns 121 of adjacent rows in a mesh type.

Figure 7:
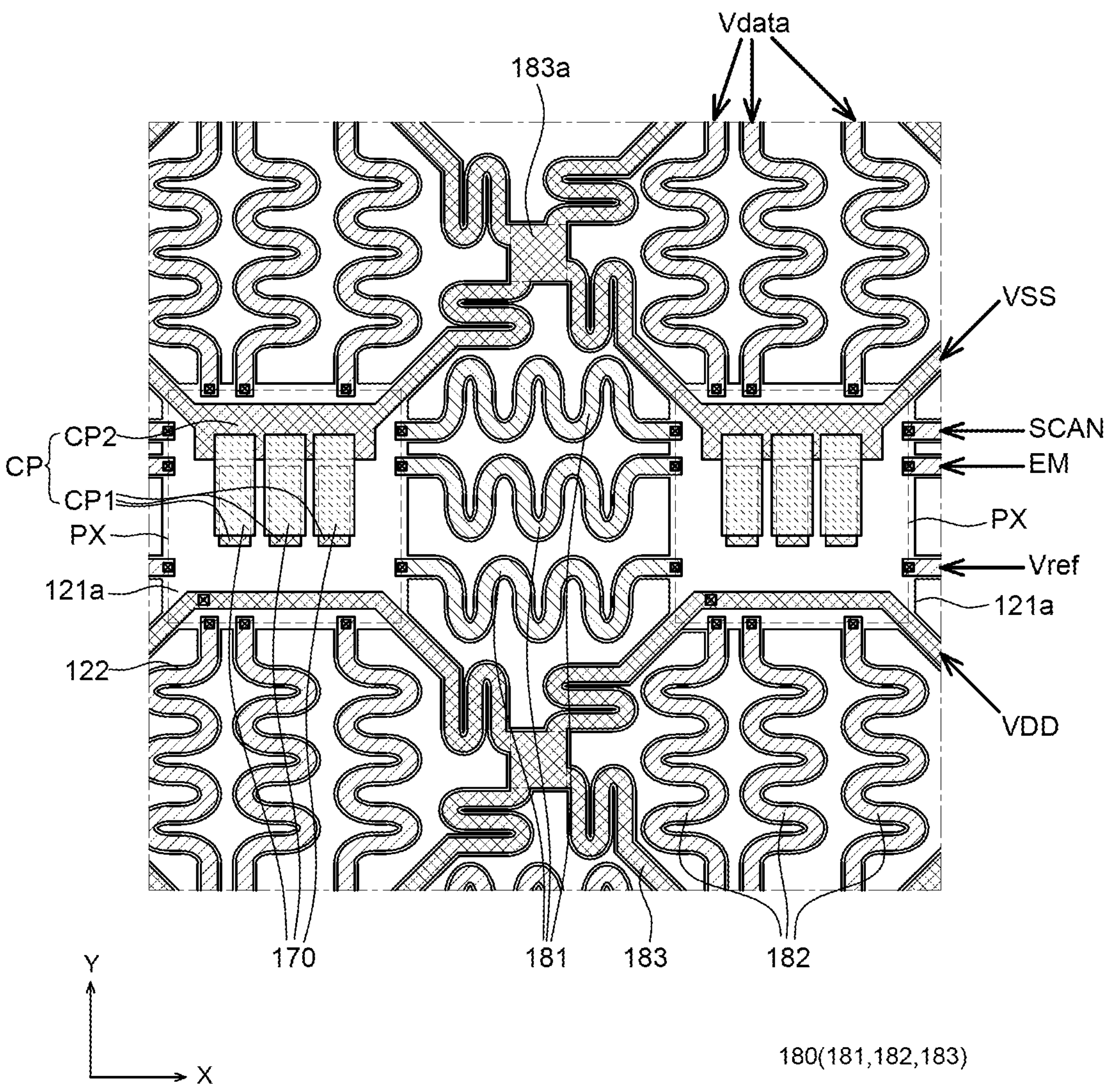
FIGS. 7 and 8 are enlarged plan views of a display device according to an example embodiment of the present disclosure.

For example, referring to FIG. 7, the plurality of third connection lines 183 disposed in the n-th row, among the plurality of third connection lines 183, may electrically connect the low potential power lines on the first plate patterns 121 disposed on an upper side and a lower side of the n-th row. The plurality of third connection lines 183 disposed in the n+1-th row may electrically connect the high potential power lines on the first plate patterns 121 disposed on an upper side and a lower side of the n+1-th row. That is, the row in which the third connection line 183 which connects the high potential power line is disposed and the row in which the third connection line 183 which connects the low potential power line is disposed may be alternately disposed.

In the meantime, in the first plate pattern 121 disposed on the lower side of the row in which the third connection line 183 which connects the low potential power line is disposed and the first plate pattern 121 disposed on the lower side of the row in which the third connection line 183 which connects the high potential power line is disposed, the plurality of LEDs 170 and the connection pad CP connected to the plurality of LEDs 170 may form a vertically symmetric structure.

Hereinafter, the first plate pattern 121 disposed on the lower side of the row in which the third connection line 183 serving as the low potential power line is disposed is assumed as a 1-1-th plate pattern 121*a*. Further, the first plate pattern 121 disposed on the lower side of the row in which the third connection line 183 serving as the high potential power line is disposed is assumed as a 1-2-th plate pattern 121*b*. Under this assumption, the vertically symmetric structure of the 1-1-th plate pattern 121*a* and the 1-2-th plate pattern 121*b* will be described, but these are not limited thereto.

First, referring to FIG. 7, the third connection line 183 serving as the low potential power line is disposed on an upper row of the 1-1-th plate pattern 121*a* and the third connection line 183 serving as the high potential power line is disposed on a lower row of the 1-1-th plate pattern 121*a*.

The third connection line 183 serving as the low potential power line extends to the upper portion of the 1-1-th plate pattern 121*a* so as to be adjacent to the upper edge of the 1-1-th plate pattern 121*a* to be integrally formed with the second connection pad CP2. Accordingly, the second connection pad CP2 may be disposed to be adjacent to the upper edge of the 1-1-th plate pattern 121*a*.

As illustrated in FIG. 4, the third connection line 183 serving as the high potential power line extends to the 1-1-th plate pattern 121*a* so as to be adjacent to the lower edge of the 1-1-th plate pattern 121*a* and may be electrically connected to the third pad PD3. Therefore, even though it is not illustrated in the drawing, the plurality of first connection pads CP1 which is applied with the high potential power voltage VDD from the third connection line 183 through the third pad PD3 is disposed between the second connection pad CP2 and the lower edge of the 1-1-th plate pattern 121*a* to be electrically connected to the plurality of LEDs 170.

Therefore, in the plurality of LEDs 170 of the 1-1-th plate pattern 121*a*, the n-electrode 174 connected to the second connection pad CP2 may be disposed to be adjacent to the upper edge of the 1-1-th plate pattern 121*a*. Further, the p-electrode 175 connected to the first connection pad CP1 may be disposed to be adjacent to the lower edge of the 1-1-th plate pattern 121*a*. Accordingly, on the 1-1-th plate pattern 121*a*, the plurality of LEDs 170 may be disposed so as to be aligned such that the n-electrode 174 is adjacent to the upper edge of the 1-1-th plate pattern 121*a* and the p-electrode 175 is adjacent to the lower edge of the 1-1-th plate pattern 121*a*.

Figure 8:
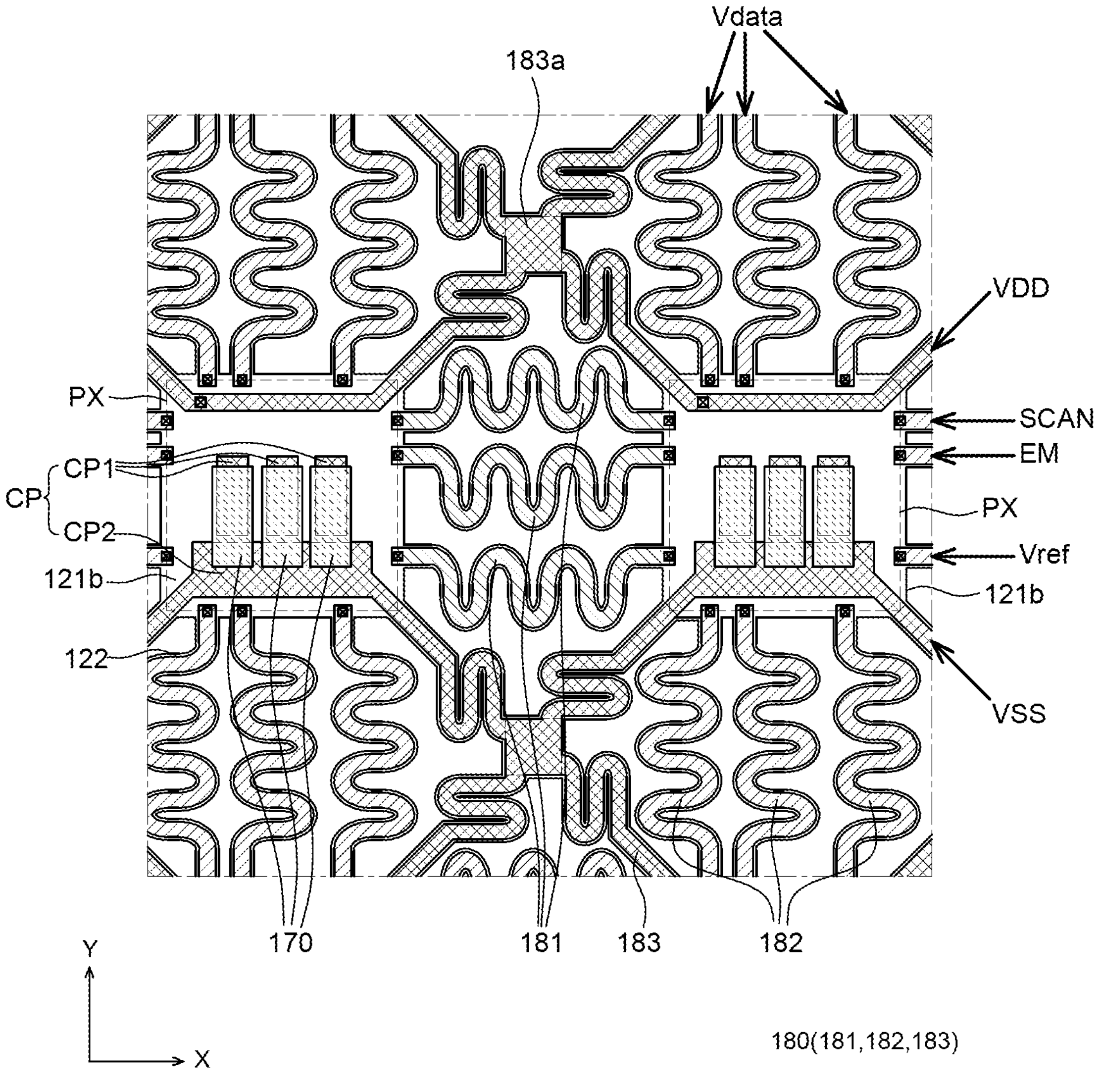

Next, referring to FIG. 8, the third connection line 183 serving as the high potential power line is disposed on an upper row of the 1-2-th plate pattern 121*b* and the third connection line 183 serving as the low potential power line is disposed on a lower row of the 1-2-th plate pattern 121*b*.

The third connection line 183 serving as the low potential power line extends to the lower portion of the 1-2-th plate pattern 121*b* so as to be adjacent to the lower edge of the 1-2-th plate pattern 121*b* to be integrally formed with the second connection pad CP2. Accordingly, the second connection pad CP2 may be disposed to be adjacent to the lower edge of the 1-2-th plate pattern 121*b*.

Further, as illustrated in FIG. 8, the third connection line 183 serving as the high potential power line extends to the upper portion of the 1-2-th plate pattern 121*b* so as to be adjacent to the upper edge of the 1-2-th plate pattern 121*b* and may be electrically connected to the third pad PD3. Therefore, even though it is not illustrated in the drawing, the plurality of first connection pads CP1 which is applied with the high potential power voltage VDD from the third connection line 183 through the third pad PD3 is disposed between the second connection pad CP2 and the upper edge of the 1-2-th plate pattern 121*b* to be electrically connected to the plurality of LEDs 170.

Therefore, in the plurality of LEDs 170 of the 1-2-th plate pattern 121*b*, the n-electrode 174 connected to the second connection pad CP2 may be disposed to be adjacent to the lower edge of the 1-2-th plate pattern 121*b*. Further, the p-electrode 175 connected to the first connection pad CP1 may be disposed to be adjacent to the upper edge of the 1-2-th plate pattern 121*b*. Accordingly, on the 1-2-th plate pattern 121*b*, the plurality of LEDs 170 may be disposed so as to be aligned such that the n-electrode 174 is adjacent to the lower edge of the 1-2-th plate pattern 121*b* and the p-electrode 175 is adjacent to the upper edge of the 1-2-th plate pattern 121*b*.

In the display device 100 according to the example embodiment of the present disclosure, the third connection line 183 connects the high potential power lines on the first plate patterns 121 of one pair of adjacent rows in the mesh type and connects the low potential power lines on the first plate patterns 121 of the adjacent rows in the mesh type. By doing this, the voltage drop of the power voltage and the luminance irregularity thereby may be minimized or reduced. For example, one first line pattern 122 configured in the X-shape is connected to each of corners of the four first plate patterns 121 which are adjacent to each other while forming a 2×2 matrix and may connect them. Further, the third connection line 183 is disposed on the X-shaped first line pattern 122 to electrically connect the high potential power lines or the low potential power lines on four first plate patterns 121. Accordingly, the high potential power line or the low potential power line on the first plate pattern 121 of one pair of adjacent rows may be connected by the third connection line 183 in a mesh type and minimizes or reduces the resistance to reduce the luminance irregularity.

In the meantime, also in the non-active area NA, the power supply PS which supplies the high potential power voltage VDD and the low potential power voltage VSS and the high potential power line and the low potential power line are connected in a mesh type to minimize or reduce the voltage fluctuation according to the resistance. Further, the luminance uniformity may be improved. Hereinafter, a power mesh connection structure of the non-active area NA will be described in more detail with reference to FIGS. 9 and 10.

Figure 9:
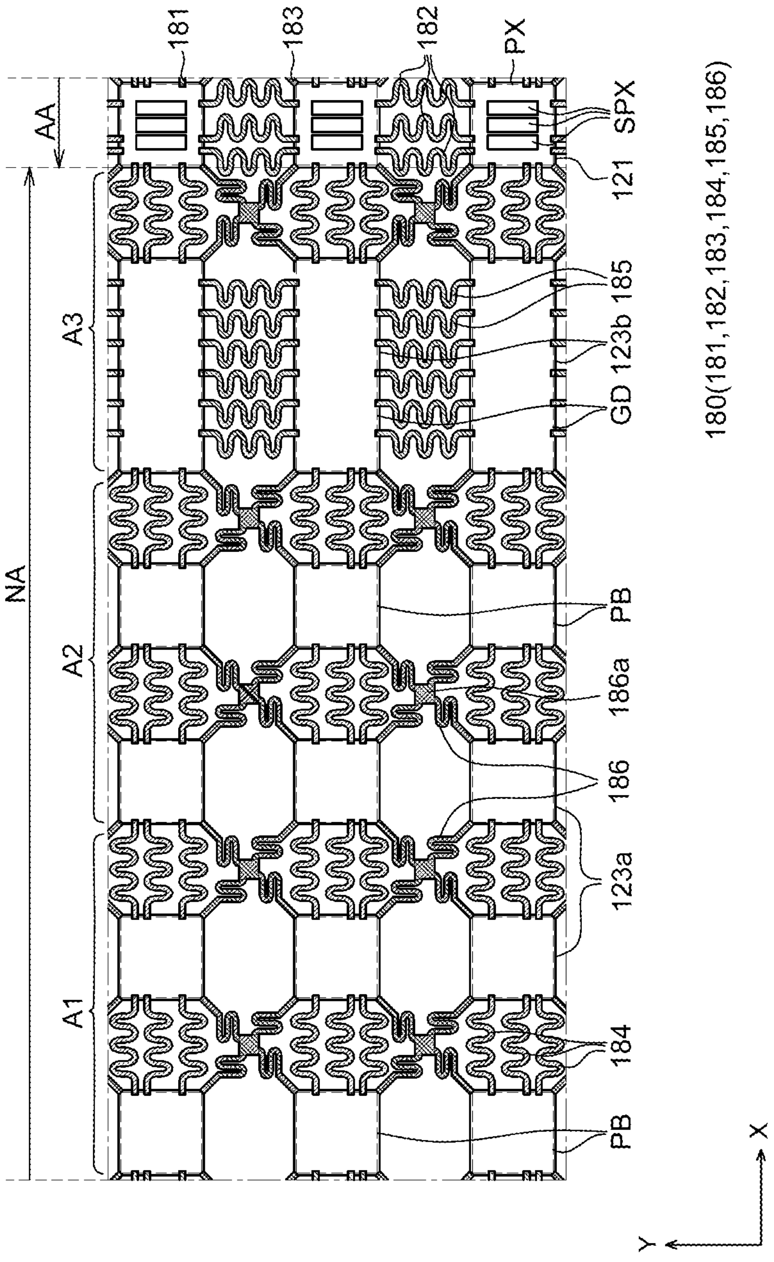
FIG. 9 is an enlarged plan view of a non-active area of a display device according to an example embodiment of the present disclosure.
Figure 10:
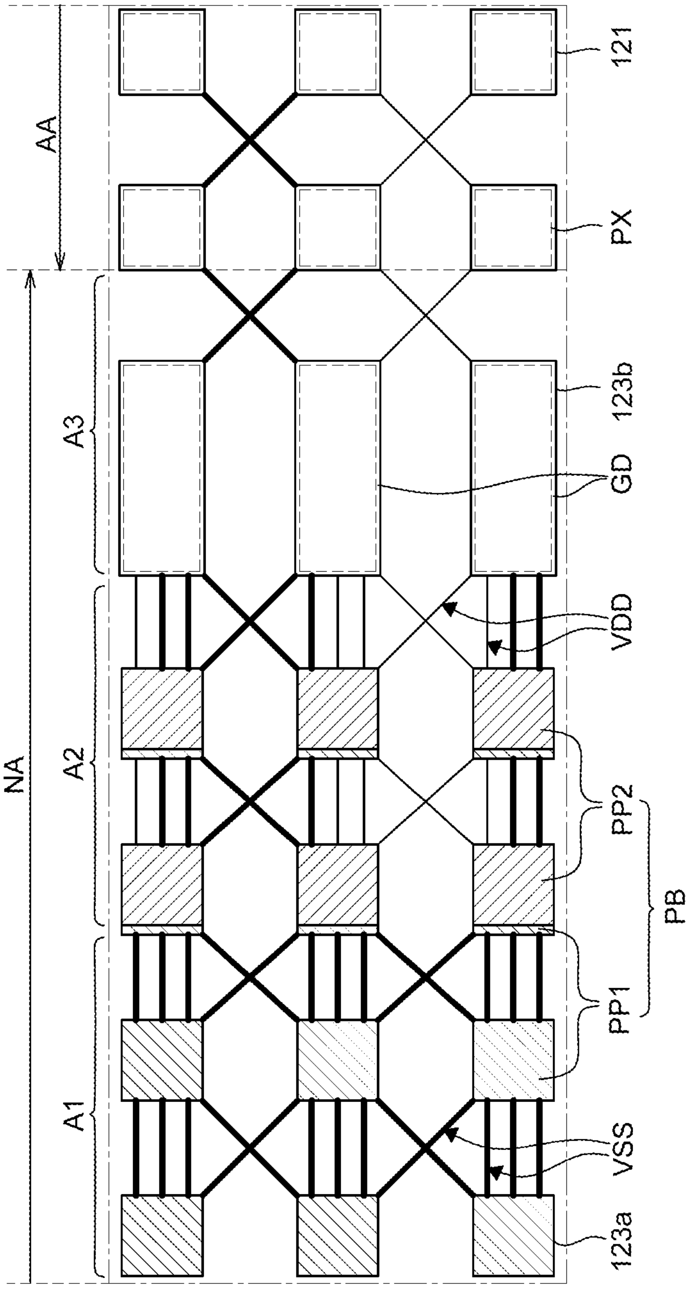
FIG. 10 is a view for explaining a transfer path of a high potential power voltage and a low potential power voltage in a non-active area of a display device according to an example embodiment of the present disclosure.

FIG. 9 is an enlarged plan view of a non-active area of a display device according to an example embodiment of the present disclosure. FIG. 10 is a view for explaining a transmission path of a high potential power voltage and a low potential power voltage in a non-active area of a display device according to an example embodiment of the present disclosure. In FIG. 10, for the convenience of description, a transmission path of the high potential power voltage VDD is illustrated with a bold solid line, a transmission path of the low potential power voltage VSS is illustrated with a bold solid line, and a plurality of connection lines 180 is simply illustrated with a straight line.

Referring to FIG. 9, a plurality of second plate patterns 123 and a plurality of second line patterns 124 are disposed in the non-active area NA. In each of the plurality of second plate patterns 123, a power supply PS and a gate driver GD are disposed and in the plurality of second line patterns 124, a fourth connection line 184, a fifth connection line 185, and a sixth connection line 186 are disposed.

The plurality of second plate patterns 123 includes a plurality of first sub plate patterns 123*a* and a plurality of second sub plate patterns 123*b*. The plurality of first sub plate patterns 123*a* is patterns in which the power supply PS is disposed and the plurality of second sub plate patterns 123*b* is patterns in which the gate driver GD is disposed. The plurality of first sub plate patterns 123*a* may be disposed in a first area A1 and a second area A2 of the non-active area NA and the plurality of second sub plate patterns 123*b* may be disposed in a third area A3 between the second area A2 and the active area AA.

Referring to FIG. 10 together, a plurality of power blocks PB which configures the power supply PS is disposed on the plurality of first sub plate patterns 123*a*. The power block PB includes a first power pattern PP1 for supplying the low potential power voltage VSS and a second power pattern PP2 for supplying the high potential power voltage VDD.

The first power pattern PP1 may be disposed on the plurality of first sub plate patterns 123*a* disposed in the first area A1 of the non-active area NA. The buffer layer 141, the gate insulating layer 142, the first interlayer insulating layer 143, the second interlayer insulating layer 144, and the passivation layer 145 which are inorganic insulating layers and the planarization layer 146 which is an organic insulating layer may be disposed on the first sub plate patterns 123*a*. The first power pattern PP1 may be disposed in any one between the plurality of inorganic insulating layers, between the plurality of inorganic insulating layers and an organic insulating layers, or above the organic insulating layer.

Both the first power pattern PP1 and the second power pattern PP2 may be disposed on the plurality of first sub plate patterns 123*a* disposed in the second area A2 of the non-active area NA. The first power pattern PP1 and the second power pattern PP2 may be disposed on different layers with the inorganic insulating layer and/or the organic insulating layer therebetween. For example, the first power pattern PP1 is disposed between the plurality of inorganic insulating layers and the second power pattern PP2 may be disposed on the organic insulating layer.

The plurality of second line patterns 124 connects the plurality of second plate patterns 123 to each other or connects the plurality of first plate patterns 121 and the plurality of second plate patterns 123. Some of the plurality of second line patterns 124 may connect the plurality of second plate patterns 123 to each other or connect the plurality of first plate patterns 121 and the plurality of second plate patterns 123 in the first direction X. The other part of the plurality of second line patterns 124 may connect the plurality of second plate patterns 123 in the second direction Y. The other part of the plurality of second line patterns 124 may connect the plurality of second plate patterns 123 to each other or connect the plurality of first plate patterns 121 and the plurality of second plate patterns 123 in a direction different from the first direction X and the second direction Y.

A plurality of fourth connection lines 184 is disposed on the plurality of second line patterns 124. The plurality of fourth connection lines 184 is lines disposed between the second plate patterns 123 in the first direction X. The plurality of fourth connection lines 184 may be disposed between the first sub plate patterns 123*a*, between the first sub plate pattern 123*a* and the second sub plate pattern 123*b*, and between the second sub plate pattern 123*b* and the first plate pattern 121, in the first direction X. Some of the plurality of fourth connection lines 184 may connect the first power patterns PP1 on the first sub plate patterns 123*a* which are adjacent to each other in the first direction X. The other part of the plurality of fourth connection lines 184 may connect the second power patterns PP2 on the first sub plate patterns 123*a* which are adjacent to each other in the first direction X. Further, the other part of the plurality of fourth connection lines 184 connects the gate driver GD and the sub pixel SPX on the first plate pattern 121 to supply a scan signal SCAN or the emission control signal EM from the gate driver GD to the sub pixel SPX.

A plurality of fifth connection lines 185 is disposed on the plurality of second line patterns 124. The plurality of fifth connection lines 185 is lines disposed between the second plate patterns 123 in the second direction Y. For example, the plurality of fifth connection lines 185 connects the stages of the gate driver GD on the second sub plate pattern 123*b* to drive the gate driver GD.

A plurality of sixth connection lines 186 is disposed on the plurality of second line patterns 124. The plurality of sixth connection lines 186 is lines disposed between the second plate patterns 123 in a direction different from the first direction X and the second direction Y. The plurality of sixth connection lines 186 may be disposed between the first sub plate patterns 123*a*, between the first sub plate pattern 123*a* and the second sub plate pattern 123*b*, and between the second sub plate pattern 123*b* and the first plate pattern 121, in the diagonal direction between the first direction X and the second direction Y.

The plurality of sixth connection lines 186 is connected to the other sixth connection line 186 extending from a corner of the second plate pattern 123 adjacent to each other to form the contact unit or contact area 186*a*. For example, fourth sixth connection lines 186 extending from different second plate patterns 123 may be connected to one contact unit 186*a*.

Some of the plurality of sixth connection lines 186 may connect the first power patterns PP1 in the mesh type and the other part of the plurality of sixth connection lines 186 may connect the second power pattern PP2 in the mesh type. Further, the other part of the plurality of sixth connection lines 186 may connect the lower potential power line on the second sub plate pattern 123*b* to the low potential power line on the first plate pattern 121 or to the first power pattern PP1 in a mesh type to supply the low potential power voltage VSS to the sub pixel SPX. Finally, the other part of the plurality of sixth connection lines 186 may connect the high potential power line on the second sub plate pattern 123*b* to the high potential power line on the first plate pattern 121 or to the second power pattern PP2 in a mesh type to supply the high potential power voltage VDD to the sub pixel SPX.

In the display device 100 according to the example embodiment of the present disclosure, the sixth connection line 186 which connects the first power patterns PP1 disposed in the non-active area NA in the mesh type is formed to reduce the resistance in the first power pattern PP1. The first power pattern PP1 disposed on the first sub plate pattern 123*a* of the non-active area NA may supply the low potential power voltage VSS to the sub pixel SPX of the active area AA through the fourth connection line 184 extending in the first direction X. At this time, some of the plurality of sixth connection lines 186 is used to connect the first power patterns PP1 disposed in each of the plurality of first sub plate patterns 123*a*. That is, the first power pattern PP1 disposed in the non-active area NA may be connected in a mesh type by the sixth connection line 186. Therefore, in the active area AA, the third connection line 183 connects the low potential power lines in a mesh type to reduce the resistance of the low potential power line. Further, in the non-active area NA, the sixth connection line 186 connects the first power pattern PP1 disposed in each of the plurality of first sub plate patterns 123*a* in a mesh type to minimize or reduce the voltage drop of the low potential power voltage VSS.

Similarly, in the display device 100 according to the example embodiment of the present disclosure, the sixth connection line 186 which connects the second power patterns PP2 disposed in the non-active area NA in the mesh type is formed to reduce the resistance in the second power pattern PP2. The second power pattern PP2 disposed on the first sub plate pattern 123*a* of the non-active area NA may supply the high potential power voltage VDD to the sub pixel SPX of the active area AA through the fourth connection line 184 extending in the first direction X. At this time, the other part of the plurality of sixth connection lines 186 is used to connect the second power patterns PP2 disposed in each of the plurality of first sub plate patterns 123*a*. That is, the second power pattern PP2 disposed in the non-active area NA may be connected in a mesh type by the sixth connection line 186. Therefore, in the active area AA, the third connection line 183 connects the low potential power lines in a mesh type to reduce the resistance of the high potential power line. Further, in the non-active area NA, the sixth connection line 186 connects the second power pattern PP2 disposed in each of the plurality of first sub plate patterns 123*a* in a mesh type to minimize or reduce the voltage drop of the high potential power voltage VDD.

The example embodiments of the present disclosure can also be described as follows:

According to an aspect of the present disclosure, there is provided a display device. The display device includes a stretchable lower substrate, a plurality of first plate patterns which is disposed on the lower substrate to be spaced apart from each other, a plurality of first line patterns disposed between the plurality of first plate patterns, and a plurality of connection lines disposed on the plurality of first line patterns. The plurality of connection lines includes a plurality of first connection lines which extends in a first direction to be connected to two first plate patterns which are adjacent to each other, a plurality of second connection lines which extends in a second direction to be connected to two first plate patterns which are adjacent to each other, a plurality of third connection lines which extends in a direction different from the first direction and the second direction to be connected to four first plate patterns which are adjacent to each other.

The display device may further include a high potential power line disposed on the plurality of first plate patterns, and a low potential power line disposed on the plurality of first plate patterns. Some of the plurality of third connection lines may connect the low potential power lines on the plurality of first plate patterns disposed in one pair of adjacent rows in a mesh structure, and the other parts of the plurality of third connection lines may connects the high potential power lines on the plurality of first plate patterns disposed in one pair of adjacent rows in a mesh structure.

The some of the third connection lines connected to the low potential power line may be disposed on a row different from that of the other parts of the third connection lines connected to the high potential power line.

The row in which the some of the third connection lines may be disposed and the row in which the other parts of the third connection lines are disposed are alternately disposed.

The display device may further include a plurality of LEDs disposed above each of the plurality of first plate patterns, a driving transistor disposed above each of the plurality of first plate patterns to supply a driving current to the plurality of LEDs, a plurality of first connection pads which connects the driving transistor and the high potential power line, and a second connection pad which connects the plurality of LEDs and the low potential power line. The second connection pad may be integrally formed with the low potential power line.

The plurality of first plate patterns may include a 1-1-th plate pattern disposed on a lower side of a row in which the some of the third connection lines are disposed, and a 1-2-th plate pattern disposed on a lower side of a row in which the other parts of the third connection lines are disposed, and the plurality of LEDs, the plurality of first connection pads, and the second connection pads disposed in each of the 1-1-th plate pattern and the 1-2-th plate pattern may form a vertically symmetric structure.

In the 1-1-th plate pattern, the second connection pad may be disposed to be more adjacent to an upper edge of the 1-1-th plate pattern than the plurality of first connection pads.

In the 1-2-th plate pattern, the plurality of first connection pads may be disposed to be more adjacent to an upper edge of the 1-2-th plate pattern than the second connection pad.

The display device may further include a plurality of second plate patterns which is disposed on the lower substrate to be spaced apart from each other and includes a plurality of first sub plate patterns and a plurality of second sub plate patterns, a plurality of second line patterns disposed between the plurality of second plate patterns and between the plurality of first plate patterns and the plurality of second plate patterns, a power supply disposed on the plurality of first sub plate patterns, and a gate driver disposed on the plurality of second sub plate patterns.

The plurality of connection lines may include a plurality of fourth connection lines which extends in the first direction to be connected to two second plate patterns which are adjacent to each other, a plurality of fifth connection lines which extends in the second direction to be connected to two second plate patterns which are adjacent to each other, and a plurality of sixth connection lines which extends in a direction different from the first direction and the second direction to be connected to four second plate patterns which are adjacent to each other.

The power supply may include a first power pattern which is disposed on the plurality of first sub plate patterns and supplies a low potential power voltage to the low potential power line, and a second power pattern which is disposed on the plurality of first sub plate patterns and supplies a high potential power voltage to the high potential power line.

Some of the plurality of sixth connection lines may connect the first power patterns on the plurality of first sub plate patterns disposed in one pair of adjacent rows in a mesh structure, and the other parts of the sixth connection lines among the plurality of sixth connection lines may connect the second power patterns on the plurality of first sub plate patterns disposed in one pair of adjacent rows in a mesh structure.

Each of the plurality of first connection lines, the plurality of second connection lines, the plurality of fourth connection lines, and the plurality of fifth connection lines may be connected to any one of an upper edge, a lower edge, a left edge, and a right edge of the plurality of first plate patterns and the plurality of second plate patterns. The plurality of third connection lines and the plurality of sixth connection lines may be connected to four corners of the plurality of first plate patterns and four corners of the plurality of second plate patterns.

The four third connection lines which extend from corners of four first plate patterns which are disposed in a 2×2 matrix and are adjacent to each other, among the plurality of first plate patterns, may be connected to each other to form an X shape. The four sixth connection lines which extend from corners of four second plate patterns which are disposed in a 2×2 matrix and are adjacent to each other, among the plurality of second plate patterns, may be connected to each other to form an X shape.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:

a lower substrate;

a plurality of first plate patterns which is disposed on the lower substrate to be spaced apart from each other;

a plurality of first line patterns disposed between the plurality of first plate patterns; and a plurality of connection lines disposed on the plurality of first line patterns, wherein the plurality of connection lines includes:

a plurality of first connection lines which extends in a first direction to be connected to two of the plurality of first plate patterns which are adjacent to each other;

a plurality of second connection lines which extends in a second direction to be connected to another two of the plurality of first plate patterns which are adjacent to each other;

a plurality of third connection lines which extends in a direction different from the first direction and the second direction to be connected to four of the plurality of first plate patterns which are adjacent to each other, wherein the plurality of first plate patterns includes:

a 1-1-th plate pattern disposed on a lower side of a row in which some of the third connection lines are disposed; and a 1-2-th plate pattern disposed on a lower side of a row in which others of the third connection lines are disposed.

2. The display device according to claim 1, further comprising:

a high potential power line disposed on the plurality of first plate patterns; and a low potential power line disposed on the plurality of first plate patterns, wherein the some of the plurality of third connection lines connect the low potential power lines on the plurality of first plate patterns disposed in one pair of adjacent rows in a mesh structure, and wherein the others of the plurality of third connection lines connect the high potential power lines on the plurality of first plate patterns disposed in one pair of adjacent rows in another mesh structure.

3. The display device according to claim 2, wherein the some of the third connection lines connected to the low potential power lines are disposed on a row different from that of the others of the third connection lines connected to the high potential power lines.

4. The display device according to claim 3, wherein the row in which the some of the third connection lines are disposed and a row in which the others of the third connection lines are disposed are alternately disposed.

5. The display device according to claim 2, further comprising:

a plurality of light-emitting diodes (LEDs) disposed above each of the plurality of first plate patterns;

a driving transistor disposed above each of the plurality of first plate patterns to supply a driving current to the plurality of LEDs;

a plurality of first connection pads which connects the driving transistor and the high potential power line; and a second connection pad which connects the plurality of LEDs and the low potential power line, wherein the second connection pad is integrally formed with the low potential power line.

6. The display device according to claim 5, wherein the plurality of LEDs, the plurality of first connection pads, and the second connection pads disposed in each of the 1-1-th plate pattern and the 1-2-th plate pattern form a vertically symmetric structure.

7. The display device according to claim 6, wherein in the 1-1-th plate pattern, the second connection pad is disposed to be more adjacent to an upper edge of the 1-1-th plate pattern than the plurality of first connection pads.

8. The display device according to claim 6, wherein in the 1-2-th plate pattern, the plurality of first connection pads is disposed to be more adjacent to an upper edge of the 1-2-th plate pattern than the second connection pad.

9. The display device according to claim 2, further comprising:

a plurality of second plate patterns which is disposed on the lower substrate to be spaced apart from each other and includes a plurality of first sub plate patterns and a plurality of second sub plate patterns;

a plurality of second line patterns disposed between the plurality of second plate patterns and between the plurality of first plate patterns and the plurality of second plate patterns;

a power supply disposed on the plurality of first sub plate patterns; and a gate driver disposed on the plurality of second sub plate patterns.

10. The display device according to claim 9, wherein the plurality of connection lines includes:

a plurality of fourth connection lines which extends in the first direction to be connected to two of the plurality of second plate patterns which are adjacent to each other;

a plurality of fifth connection lines which extends in the second direction to be connected to another two of the plurality of second plate patterns which are adjacent to each other; and a plurality of sixth connection lines which extends in a direction different from the first direction and the second direction to be connected to four of the plurality of second plate patterns which are adjacent to each other.

11. The display device according to claim 10, wherein the power supply includes:

a plurality of first power patterns which are disposed on the plurality of first sub plate patterns and supplies a low potential power voltage to the low potential power line; and a plurality of second power pattern which are disposed on the plurality of first sub plate patterns and supplies a high potential power voltage to the high potential power line.

12. The display device according to claim 11, wherein some of the plurality of sixth connection lines connect the first power patterns on the plurality of first sub plate patterns disposed in one pair of adjacent rows in a mesh structure; and others of the sixth connection lines among the plurality of sixth connection lines connect the second power patterns on the plurality of first sub plate patterns disposed in one pair of adjacent rows in another mesh structure.

13. The display device according to claim 10, wherein each of the plurality of first connection lines, the plurality of second connection lines, the plurality of fourth connection lines and the plurality of fifth connection lines is connected to any one of an upper edge, a lower edge, a left edge, and a right edge of the plurality of first plate patterns and the plurality of second plate patterns; and the plurality of third connection lines and the plurality of sixth connection lines are connected to four corners of the plurality of first plate patterns and four corners of the plurality of second plate patterns.

14. The display device according to claim 13, wherein four of the plurality of third connection lines which extend from corners of four first plate patterns which are disposed in a 2×2 matrix and are adjacent to each other, among the plurality of first plate patterns, are connected to each other to form an X shape; and four of the plurality of sixth connection lines which extend from corners of four second plate patterns which are disposed in a 2×2 matrix and are adjacent to each other, among the plurality of second plate patterns, are connected to each other to form an X shape.

* * * * *